United States Patent [19]

Rusznyak

[11] Patent Number: 4,492,932
[45] Date of Patent: Jan. 8, 1985

[54] AMPLIFIER CIRCUIT HAVING A HIGH-IMPEDANCE INPUT AND A LOW-IMPEDANCE OUTPUT

[75] Inventor: Andreas Rusznyak, Chêne-Bougeries, Switzerland

[73] Assignee: Asulab S.A., Bienne, Switzerland

[21] Appl. No.: 419,887

[22] Filed: Sep. 20, 1982

[51] Int. Cl.³ .............................. H03F 1/38; H03F 3/16
[52] U.S. Cl. ...................................... 330/300; 330/262; 330/292; 330/311; 330/156
[58] Field of Search ............... 330/262, 291, 292, 277, 330/300, 311, 156; 324/123 R, 123 C

[56] References Cited

U.S. PATENT DOCUMENTS 3,436,672  4/1969  Delagrange .................. 330/277
3,995,175  11/1976  Hoyt et al. ................. 324/123 R

OTHER PUBLICATIONS

Maddox, H. L., "High Input Impedance Capacitance Coupled Voltage Probes", Western Electric Technical Digest No. 45, Jan. 1977, pp. 27-29.

Primary Examiner—James B. Mullins
Attorney, Agent, or Firm—Pollock, Vande Sande & Priddy

[57] ABSTRACT

An electronic circuit for a high impedance probe for an instrument for measuring electrical voltages, comprising an input field effect transistor 15 connected in a source-follower configuration, a bipolar transistor 17 connected in an emitter-follower configuration and controlled by the transistor 15, a current source 18 serving as a load for the transistor 17, an amplifier 19 having a gain G which is slightly less than unity, the input of the amplifier being controlled by the transistor 15, and finally a resistor 20 which serves as a load for the transistor 15 and which connects the source of the transistor 15 to the output 8 of the amplifier 19, said output also serving as the output of the circuit, which is supplied by a voltage source applied between the current source 18 and the collector of the transistor 17. By virtue of the amplifier 19, the effective load resistance seen by the transistor 15 is $R_{20}/(1-G)$, $R_{20}$ being the value of the resistor 20. If G is slightly less than unity, a substantial effective load resistance can be obtained with a low value in respect of the resistor 20. The d.c. voltage drop in the resistor 20 will thus be low, which permits the circuit to be supplied at a low voltage and to dissipate a small amount of energy, which represents the main aim sought by the present invention.

11 Claims, 10 Drawing Figures

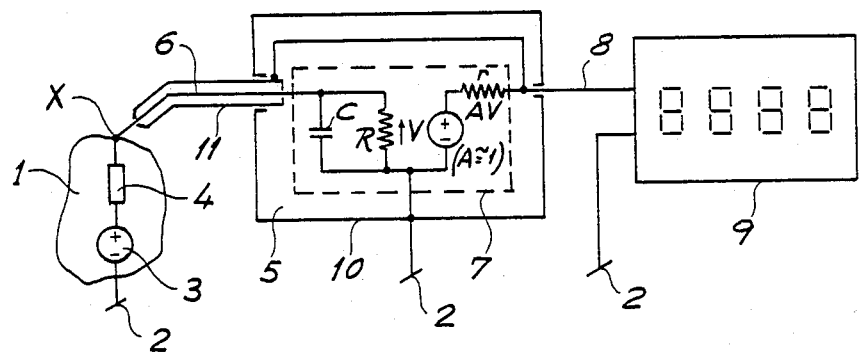
Fig.1
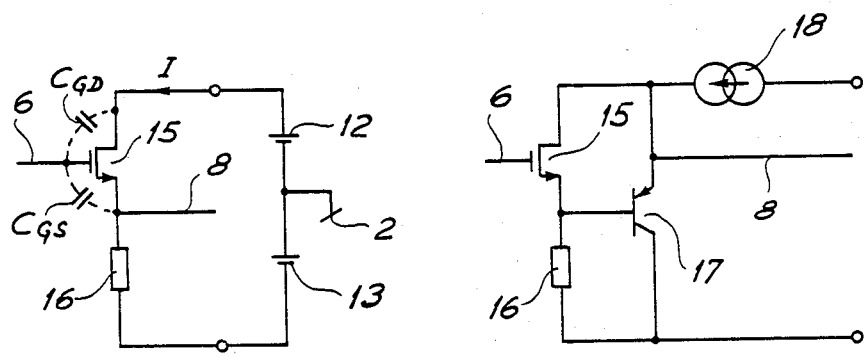
Fig.2
PRIOR ART
Fig.3
PRIOR ART

AMPLIFIER CIRCUIT HAVING A HIGH-IMPEDANCE INPUT AND A LOW-IMPEDANCE OUTPUT

BACKGROUND OF THE INVENTION

The present invention relates to instruments including a probe for measuring electrical voltages and more particularly concerns an electronic amplifier circuit for such a probe, which imparts thereto a high input impedance so as to minimise the interference produced by the probe when measuring continuous or variable signals at a very low power level.

Measuring operations of this kind are generally carried out for example in biology and in chemistry and indeed in tests on integrated circuits.

The essential characteristic of a probe for performing such measurement operations, whether the probe is passive or active, is given by its input impedance which must be as high as possible. The input impedance of the probe may be represented to a high degree of approximation by a resistor connected in parallel with a capacitor. The best performances are attained by probes which contain active devices such as transistors as they have a high input impedance and as they make it possible to produce output signals which are substantially of the same magnitude as the signals being measured. The circuit for a probe, in accordance with the present invention, falls into that category.

The active devices which are available at the present time, for example field effect or MOS transistors, make it possible to give very high input resistance values. On the other hand, the parasitic capacitances associated with such devices are not always negligible and, unless precautions are taken, the influence of such capacitances may give rise to substantial error, in particular when measuring high-frequency voltages.

The method which is generally employed for attenuating the effect of an element (for example a resistor or a capacitor) on a circuit is a feedback control, which comprises applying to one terminal of the element, a voltage which is substantially equal to the voltage at its other terminal. In fact, if that voltage difference is zero, the current passing through the element will also be zero and the circuit will behave as if that element had infinite impedance.

Circuits based on that principle have long been known and produce a good performance. The literature includes for example the article by D. P. Stokesberry (Proc. of the IEEE, Jan. 1966, page 66) which describes a simple circuit for a probe, using two discrete transistors and a Darlington amplifier. Proper operation of that circuit requires the voltage gain of the emitter-followers to be close to unity, which requires a substantial bias current for the transistors and high-resistance load resistors. This means that the supply to that circuit requires a high voltage, 75 volts in this case, which results in a high level of heat dissipation. This is obviously a serious limitation in regard to use of such a circuit and also makes it unsuitable for production in integrated form.

Another circuit which does not suffer from these deficiencies has been more recently described by H. J. De Man et al (IEEE J. Solid-State Circuits, vol. SC-12, No 3, June 1977). This circuit is in the form of an integrated circuit and the supply voltage required is only 18 volts. The characteristics of the circuit are very good since it has an input resistance of more than 1000 MΩ and an input capacitance of the order of 0.1 pF. However, this circuit is complicated in structure, based on using a differential amplifier. It comprises about ten transistors, and many other components.

SUMMARY OF THE INVENTION

The main object of the present invention is to provide an electronic circuit for a high-impedance measuring probe which uses feedback control and which has the advantage over the known circuits of being capable of operating with a low supply voltage, dissipating little power, being of simple design without any high-value resistor, being capable of easy manufacture either using discrete components which do not require any selection or matching or in the form of an integrated circuit, and, finally, having very good characteristics from the point of view of its input impedance at up to high frequencies, for example frequencies of several MHz.

To achieve that aim, the electronic amplifier circuit according to the invention, which has a high-impedance input and low-impedance output, comprises:

a field effect transistor, the gate of which forms said input, a first bipolar transistor having its base connected to the source of the field effect transistor and its emitter connected to the drain of the same transistor, a current source having a terminal connected to the emitter of the first bipolar transistor, a supply source having two poles, the first of which is connected to the other terminal of the current source, a first resistor having a terminal connected to the source of the field effect transistor and an amplifier having a positive gain which is slightly less than unity, having its input connected either to the source or to the drain of the field effect transistor, its output connected to the other terminal of the first resistor, and its supply terminals connected to the two poles of the supply source, the collector of the first bipolar transistor in turn being connected either to the output of said amplifier or to the second pole of the supply source, the output of said circuit being formed either by the emitter of the first bipolar transistor or by the output of said amplifier.

The advantage resulting from using an amplifier with a positive gain G, that is slightly less than unity, is that the first resistor which serves as a load resistor for the field effect transistor and which is advantageously of as high a resistance value as possible may be replaced, by virtue of the amplifier, by a resistor which is (1−G) times smaller, without reducing the gain of the field effect transistor. This means that, with the same current in the MOS transistor, the voltage drop in the resistor will be (1−G) times lower in the case of the present invention than in the situation corresponding to a conventional circuit. This reduction in voltage obviously has a favourable effect on the supply voltage which may be reduced by the same amount. On the other hand, as the amplifier with gain G may be provided by means of a single additional transistor, the circuit according to the invention is still very simple and easy to produce in integrated form, which having a very high input impedance.

BRIEF DESCRIPTION OF THE DRAWINGS

Other features of the present invention will be more clearly apparent from the following description which is given with reference to accompanying drawings by way of non-limiting example of an embodiment of such a circuit for a high-impedance measuring probe. In the drawings:

FIG. 1 is a circuit diagram of a probe in association with the object to be measured and the instrument displaying the value measured;

FIG. 2 shows a known simple circuit having a single transistor for a probe, and the parasitic capacitances;

FIG. 3 shows a more highly developed known circuit for a probe in which the parasitic capacitances are compensated;

DESCRIPTION OF THE PREFERRED EMBODIMENTS

Figure 4A:
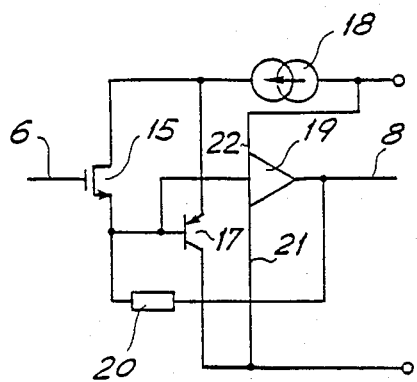
FIG. 4a shows a preferred embodiment of a circuit for a probe, in accordance with the invention.

In order to identify the problem involved and to make the following description of the invention clearer, FIG. 1 shows the method of measuring an electrical voltage at point X of an object 1, with respect to an earth point 2. The object 1 to be measured may equally well be a biological cell or an integrated circuit. From the electrical point of view, it can be replaced by an equivalent circuit diagram comprising a voltage source 3 in series with an impedance 4 which is generally resistive and of high value.

The measurement is made by means of a probe 5 having a measuring electrode 6, which is brought into contact with the point X. The electrode 6 is connected to an active circuit 7 which may be represented by an equivalent circuit diagram comprising a capacitor C and a resistor R which are connected between the electrode 6 and the earth point 2, and a voltage generator AV having one of its terminals connected to the earth point 2 and the other terminal connected to one of the terminals of a small resistor r representing the output resistance of the circuit. The other terminal of the resistor r forms the output 8 of the circuit of the probe 5. The output 8 is connected to the input of an oscilloscope or, as shown in FIG. 1, to a voltmeter 9 which displays the value of the voltage measured, for example in digital form. Finally, a screen 10, which is connected to the earth point 2, protects the probe from electrical interference.

The voltage V which exists at point X at the moment that the measurement is taken is also to be found at the terminals of the capacitor C and the resistor R. The circuit of the probe is generally so designed that the voltage generator AV produces a voltage which is slightly less than V. This means that the value of A, which defines the gain of the circuit, must be positive and slightly less than unity.

In order for the measurement taken to be accurate, the input impedance of the probe which is formed by the capacitor C and the resistor R must be high with respect to the impedance 4 of the object 1 to be measured, which is already assumed to be large in value. As the parasitic capacitance between the electrode 6 and the adjoining objects is added to the capacitance C, the influence thereof must be minimised. For that purpose, the electrode 6 is protected by a screen 11 which is connected to the output 8 of the circuit of the probe. The screen 11, the capacitance of which with respect to the adjacent objects does not give rise to difficulty, is therefore at the voltage AV and the voltage between the electrode 6 and the screen 11 is thus $(1-A)$ V. The current through the inevitable capacitance between the electrode 6 and the screen 11 is therefore $(1-A)$ times lower in this case than in the case where the screen 11 would be directly connected to the earth point 2. In other words, the apparent capacitance which loads the electrode 6, due to the screen 11, is reduced by a factor $(1-A)$ to a value which may be negligible with respect to the capacitance C of the probe.

FIG. 2 shows a simple known circuit which can be used in a probe. It comprises an input field effect transistor 15, for example of n-channel MOS type, and a resistor 16 connected to the source of the transistor. The gate of the transistor 15 is connected to the measuring electrode 6 and the source of the transistor forms the output 8 of the circuit of the probe. Two batteries 12 and 13 which are connected in series supply power to the circuit. The point common to the batteries 12 and 13 is connected to the earth point 2, the positive pole of the battery 12 is connected to the drain of the transistor 15 and the negative pole of the battery 13 is connected to the resistor 16. The voltages of the batteries are so selected as to determine the desired working point of the transistor 15 when the measuring electrode 6 does not receive any signal.

The transistor 15 is connected in a source-follower mode, of which the gain A', being positive and less than 1, is as follows:

$$A' = g_m R_{16}/(1 + g_m R_{16})$$

in which $g_m$ is the transconductance of the transistor 15 and $R_{16}$ is the value of the resistor 16. If it is noted that $g_m$ is proportional to the square root of the current I which flows through the transistor, it will be seen that the gain A' will increasingly approach unity as I and $R_{16}$ are increased in value. This results in a high supply voltage for the circuit and a high level of energy dissipation in the components.

The circuit shown in FIG. 2 provides an amplifier which allows to measure a voltage with a gain A'. However, there may be a constant d.c. voltage shift between the input voltage and the output voltage, which voltage shift depends only on the characteristics of the components used. Taking that d.c. voltage shift into account, d.c. and a.c. voltages may be measured.

FIG. 2 also shows the parasitic capacitances $C_{GS}$ between the gate and the source and $C_{GD}$ between the gate and the drain of the transistor 15. Such capacitances intervene directly in the input capacitance C of the probe, but in different ways. As the voltage of the drain of the transistor 15 is constant, the capacitance $C_{GD}$ is related entirely to the electrode 6. On the other hand, as the voltage between the gate and the source of the transistor 15 is $(1-A')$ times the measuring voltage, the apparent value of the capacitance $C_{GS}$, which actually loads the electrodes 6, is only $(1-A')$ $C_{GS}$. The input capacitance of the probe is therefore:

$$C = C_{GD} + (1-A')C_{GS}$$

in the situation shown in FIG. 2.

An improved circuit having a lower input capacitance than the circuit shown in FIG. 2 is shown in FIG. 3. As in the above described circuit, the FIG. 3 circuit comprises an input MOS transistor 15, to the source of which is connected the resistor 16, and also a transistor 17, for example of bipolar type, the base of which is connected to the source of the transistor 15, the emitter of which is connected to the drain of the transistor 15 and the collector of which is connected to the free terminal of the resistor 16. Finally, a current source 18 has one of its terminals connected to the emitter of the transistor 17. The control gate of the transistor 15 is connected to the measuring electrode 6 and the emitter of the transistor 17 forms the output 8 of the circuit of the probe. The parasitic capacitances of the transistor 15, and the supply source for the circuit, which connects the collector of the transistor 17 to the other terminal of the current source 18, are not shown either in FIG. 3 or in the following Figures.

The transistor 17 operates in an emitter-follower configuration, having the current source 18 as a load. Let $A''$ be the gain, which is positive and slightly less than 1, of the emitter-follower. The total gain between the gate of the transistor 15 and the emitter of the transistor 17 is then $A'A''$. The voltage which appears between the gate and the emitter is $(1-A'A'')$ times the measuring voltage and the apparent value of the gate-drain capacitance of the transistor 15 is reduced to $(1-A'A'')$ $C_{GD}$, for the same reasons as those set forth in relation to the gate-source capcitance. The input capacitance of the probe of the circuit of FIG. 3 is thus of the following value:

$$C = (1-A'A'')C_{GD} + (1-A')C_{GS}$$

which can be made very small, of the order of 0.1 pF.

The circuit diagram shown in FIG. 4a illustrates a preferred probe circuit according to the invention. The circuit comprises transistors 15 and 17 and the current source 18, which are connected in the same manner as in FIG. 3, and also an amplifier 19 having a positive gain G which is slightly less than unity, and finally, a resistor 20 forming the load of the transistor 15. The amplifier is connected to supply source (not shown) by connections 21 and 22. Connected to the source of the transistor 15 is a terminal of the resistor 20 and the input of the amplifier 19. The other terminal of the resistor 20 is connected to the output 8 of the amplifier 19. The collector of the transistor 17 is in turn connected to a pole of the supply source. The output 8 of the amplifier 19 forms the preferred output of the circuit but the emitter of the transistor 17 can also be used for that purpose.

From the point of view of the input capacitance of the probe, the circuit shown in FIGS. 3 and 4a behave in a similar manner. On the other hand, the resistor 20 shown in FIG. 4a may be much lower in value than the corresponding resistor 16 in FIG. 3, while serving the same purpose as a high load resistance for the transistor 15. In fact, by virtue of the amplifier 19 with its gain G, and with a given measuring voltage, the voltage at the terminals of the resistor 20 is $(1-G)$ times lower than that which appears at the terminals of the resistor 16. If $R_{20}$ is used to denote the value of the resistor 20, the apparent value thereof for the transistor 15 is $R_{20}/(1-G)$. By making it equal to the value $R_{16}$ of the resistor 16, we have:

$$R_{16} = R_{20}/(1-G).$$

If G is positive and slightly less than unity, $R_{16}$ will appear as being of high value, even if the value of $R_{20}$ is low. The same bias current for the transistor 15 will thus produce a voltage drop, in the resistor 20 of the circuit shown in FIG. 4a, which is lower than in the resistor 16 of the circuit shown in FIG. 3. That voltage difference will permit a corresponding reduction in the supply voltage of the circuit and the power dissipation thereof. That is the main aim sought to be achieved by the present invention.

Figure 4B:
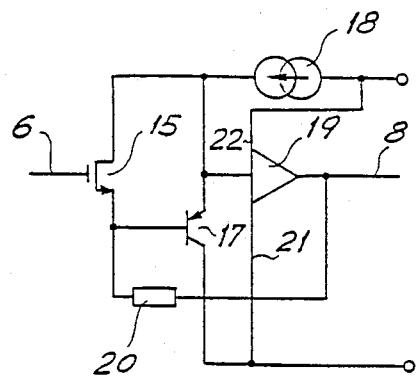
FIGS. 4b, 4c and 4d are alternative forms of the FIG. 4a circuit, which are produced by different connection of the input of the amplifier and the collector of the first bipolar transistor.

In an alternative form of the circuit shown in FIG. 4a, the input of the amplifier 19 may be connected to the emitter of the transistor 17, as shown in FIG. 4b. All the components which are shown in FIGS. 4a and 4b are otherwise identical so that they are denoted by the same references. The transistor 17, in conjunction with the current source 18, having a gain $A''$, the gain G which has been previously used to determine the value $R_{20}$ of the resistor 20, must obviously be replaced in this new configuration by $G' = A''G$. As the gains $A''$ and G are positive and slightly less than unity, the same will apply in respect of the gain $G'$.

Figure 4C:
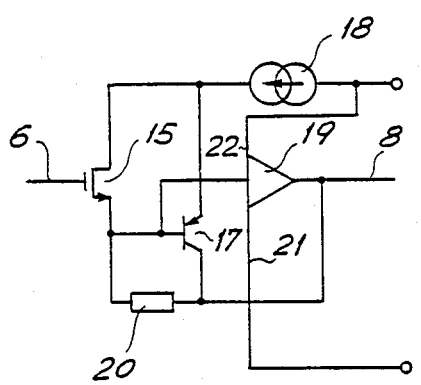
Figure 4D:
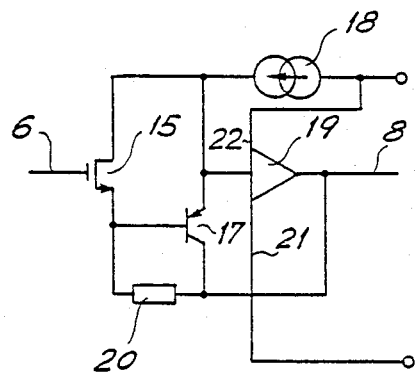

As another alternative form of the circuits shown in FIGS. 4a and 4b, the collector of the transistor 17 may be connected to the output 8 of the amplifier 19, as shown in FIGS. 4c and 4d. That has the advantage of reducing the effect of the collector-base capacitance of the transistor 17, without modifying the operating principle of the circuits.

Figure 5:
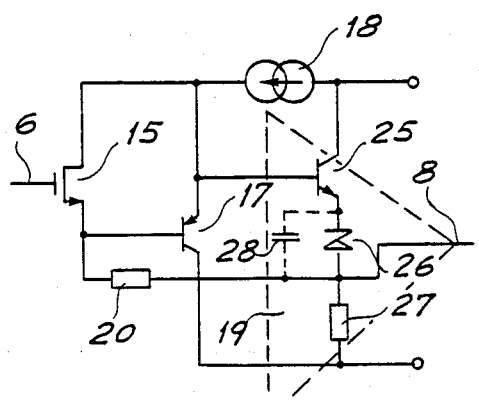
FIG. 5 shows in detail the diagram of a circuit according to the invention.

By way of example, FIG. 5 shows a circuit corresponding to the alternative form shown in FIG. 4b, as just described above. The common components in the circuits shown in FIGS. 4b and 5 are the transistors 15 and 17, the current source 18 and the resistor 20 as already described hereinbefore. It should be noted that the current source 18 may be very easily formed in known manner by using a field effect or bipolar transistor or, more approximately, by using a resistor. The amplifier 19 shown in FIG. 5 comprises a transistor 25, for example of bipolar type, but of opposite polarity to the transistor 17, being arranged in an emitter-follower configuration, the base thereof, which corresponds to the input of the amplifier 19, being connected to the emitter of the transistor 17, while its collector is connected to the common point formed by the current source 18 and a pole of the supply source (not shown); the emitter of the transistor 25 is in turn connected to a terminal of a Zener diode 26, the other terminal of the diode forming the output of the amplifier 19 and the preferred output 8 of the probe circuit. Connected to that output are the resistor 20 and a terminal of a resistor 27, the other terminal of which is connected to the collector of the transistor 17 to which the other pole of the supply source (not shown) is also connected. A capacitor 28 may be connected in parallel with the Zener diode in order to improve the performance of the circuit at high frequencies. The gain of the transistor 25 associated with the resistor 27 represents the gain of the amplifier 19. The output of the probe circuit can thus be taken at the emitter of the transistor 17.

The circuit shown in FIG. 5 is not critical from the point of view of the value of the components used. It may be assembled using a limited number of discrete components, requiring neither selection nor matching, and the working point of the circuit is automatically adjusted. As it dissipates little energy and as it does not contain any resistance of high value, the circuit is highly suitable for integration. These various properties are another advantage of the present invention.

Figure 6:
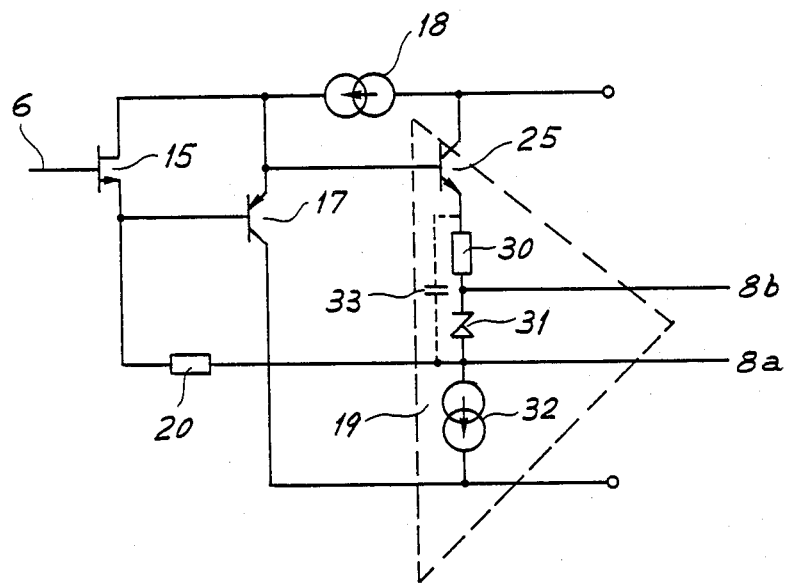
FIG. 6 shows an improved version of the circuit according to the invention, as shown in FIG. 5.

The amplifier circuit shown in FIG. 6, which corresponds to another embodiment of the invention, is an improved version of the circuit shown in FIG. 5. The components which are common to the two versions are denoted by the same reference numerals. The improvement essentially relates to the characteristics of the amplifier 19, the resistor 27 of which has been replaced by a current source 32. One of the terminals of the current source 32 in FIG. 6 is connected to one of the terminals of the supply source while the other terminal is connected to one of the terminals of a Zener diode 31 which performs a similar function to the Zener diode 26 in FIG. 5. In addition, a variable resistor 30 connects the emitter of the transistor 25 to the other terminal of the Zener diode 31. Finally, a capacitor 33 may be connected between the emitter of the transistor 25 and the junction point between the Zener diode 31 and the current source 32. The purpose of the capacitor 33 is to improve the high-frequency performance of the circuit in the same manner as the capacitor 28 in the circuit shown in FIG. 5.

The amplifier 19 shown in FIG. 6 has two outputs, a main output 8a which is taken at the junction point between the Zener diode 31 and the current source 32, and an auxiliary output 8b which is taken at the junction point between the resistor 30 and the Zener diode 31. One of the terminals of the resistor 20 is connected to the output 8a which therefore performs a function similar to the output 8 of the circuit shown in FIG. 5. If the input electrode 6 receives a signal, alternating voltages of the same amplitude and in phase will appear at the outputs 8a and 8b, but the d.c. voltage thereof will be shifted by the value of the voltage of the Zener diode 31. The d.c. voltage difference between the input 6 and one of the outputs 8a and 8b may be altered by varying the resistor 30, for example in such a way as to make the d.c. voltage difference between the input 6 and the main output 8a equal to zero, when the circuit is in the rest condition. As the Zener diode 31 has a constant current passing therethrough, being produced by the current source 32, the Zener diode 31 may also be replaced by a passive dipole comprising either one or more simple diodes or a resistor.

The transistor 25 of the amplifier 19, as shown in FIGS. 5 and 6, is connected in an emitter follower configuration. The load of that transistor is formed by the resistor 27 in FIG. 5 or by the current source 32 in FIG. 6. Now, it is well known that the levels of performance of a transistor disposed in an emitter-follower configuration improve in proportion to an increasing value in respect of the load. In fact, a high load has the advantage of increasing the input impedance of the transistor, of adjusting the gain thereof towards unity and finally, making it less sensitive in operation to variations in the supply voltage. As a current source is theoretically equivalent to a load of infinite value, as it does not require a high supply voltage and as it can be very easily implemented in known manner by means of a single transistor, the use thereof provides nothing but advantages.

The main advantage of the amplifier circuit shown in FIG. 6 is that the gain G, which is already defined in respect of the amplifier 19, is closer to unity in this circuit than in the circuit shown in FIG. 5. Moreover, as has been shown above, the smaller the difference $(1-G)$, the lower can be the value of the resistor 20, with the amplifier circuit giving the same performance. Now, a low value in respect of the resistor 20 permits the amplifier circuit to be supplied with a low voltage, which is one of the aims that the present invention seeks to achieve.

Each of the outputs 8a and 8b of the amplifier shown in FIG. 6 may be connected to a measuring instrument, for example an electronic voltmeter or an oscilloscope. In order not to downgrade the performance of the amplifier, in particular its high-frequency performance, however, the capacitive load represented by the measuring instrument must not exceed about 10 pF. This is a low value, which involves the use of a probe between the amplifier and the measuring instrument. Now, if a probe is formed by passive components, the probe causes attenuation of the signal, which correspondingly reduces the sensitivity of the instrument to which it is connected.

Figure 7:
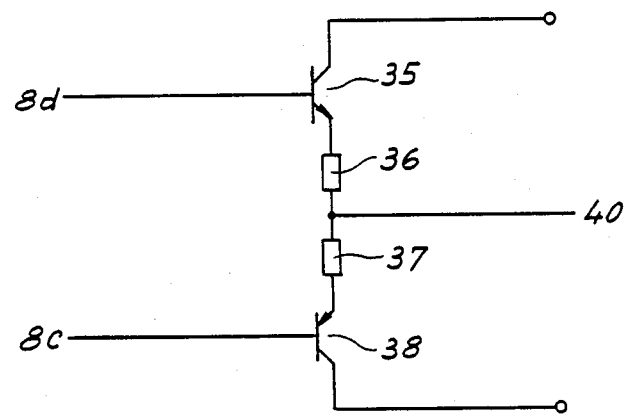
FIG. 7 shows the circuit diagram of an interface amplifier which can be connected directly to the FIG. 6 circuit.

In order to avoid that disadvantage which occurs not only with the circuit shown in FIG. 5 but also with all the above-described amplifier circuits, it is advantageous to use an interface amplifier circuit, instead of the probe. An interface amplifier circuit which is particularly suitable for the amplifier circuit shown in FIG. 6 is illustrated in FIG. 7. It comprises a bipolar transistor 35 which is of opposite polarity to the transistor 17 and which has its collector connected to a terminal of the supply source, while its emitter is connected to a terminal of a resistor 36. The other terminal of the resistor 36 is connected to a terminal of a resistor 37, the other terminal of which is connected to the emitter of a bipolar transistor 38, of the same polarity as the transistor 17. The collector of the transistor 38 is connected to the other terminal of the supply source. The resistors 36 and 37 serve to define the current through the transistors 35 and 38. The interface amplifier has two inputs 8c and 8d which are formed respectively by the bases to the transistors 38 and 35, and an output 40 taken at the junction point between the resistors 36 and 37.

The inputs 8c and 8d of the interface amplifier shown in FIG. 7 may be connected directly to the outputs 8a and 8b respectively of the amplifier shown in FIG. 6, provided that the Zener diode 31 and the resistors 36 and 37 have been suitably selected. That association makes it possible to form a single amplifier which has a gain very close to unity, its input being denoted by reference numeral 6 and its output being denoted by reference numeral 40. The d.c. voltage difference between the input and the output may be nullified by means of the variable resistor 30. If the resistors 36 and 37 are sufficiently low in value, the output 40 may carry a capacitive load of about 100 pF and may be used for directly feeding a measuring instrument.

What is claimed is:

1. An electronic amplifier circuit having a high-impedance input and a low-impedance output, comprising:
   a field effect transistor, the gate of which forms said input;
   a first bipolar transistor having its base connected to the source of the field effect transistor and its emitter connected to the drain of the same transistor;
   a first current source having one terminal connected to the emitter of the first bipolar transistor;
   a supply source having two poles, the first of which is connected to the other terminal of the current source;

a first resistor having a terminal connected to the source of the field effect transistor; and an amplifier with a positive gain which is slightly less than unity, having its input connected to the source of the field effect transistor, its output connected to the other terminal of the first resistor, and its supply terminals connected to the two poles of the supply source, the collector of the first bipolar transistor in turn being connected to the second pole of the supply source, the output of said circuit being formed either by the emitter of the first bipolar transistor or by the output of said amplifier.

2. The electronic circuit of claim 1 wherein said amplifier comprises:

a second bipolar transistor which is of opposite polarity to the first bipolar transistor and the base of which is connected to the emitter of the first bipolar transistor while its collector is connected to the point formed by the connection of the first current source with the first pole of the supply source;

a Zener diode having a terminal connected to the emitter of the second bipolar transistor; and a second resistor having a terminal connected to the point formed by the connection of the other terminal of the first resistor to the other terminal of the Zener diode and the other terminal connected to the second pole of the supply source;

the output of said circuit being formed either by the emitter of the first bipolar transistor or by one of the two terminals of the Zener diode.

3. The electronic circuit of claim 2 further comprising a capacitor connected in parallel with the Zener diode.

4. The electronic circuit of claim 1 wherein said amplifier comprises:

a second bipolar transistor which is of opposite polarity to the first bipolar transistor and the base of which is connected to the emitter of the first bipolar transistor while its collector is connected to the point formed by the connection of the first current source with the first pole of the supply source;

a second resistor having a terminal connected to the emitter of said second bipolar transistor;

a passive dipole having a terminal connected to the other terminal of said second resistor; and a second current source having a terminal connected to the point formed by the connection of the other terminal of the first resistor and the other terminal of the passive dipole, the other terminal being connected to the second pole of the supply source;

a first output of said circuit being formed by the connecting point between said passive dipole and said second current source; and a second output of said circuit being formed by the connecting point between said second resistor and said passive dipole.

5. The electronic circuit of claim 4 further comprising a capacitor connected between the emitter of the second bipolar transistor and the first output of said amplifier circuit.

6. The electronic circuit of claim 4 wherein that said passive dipole comprises a Zener diode.

7. The electronic circuit of claim 4 further comprising an interface amplifier having an input and an output, the input of said interface amplifier being connected to the output of said amplifier.

8. The electronic circuit of claim 7 wherein said interface amplifier comprises:

a first bipolar power transistor of opposite polarity to the first bipolar transistor, having its collector connected to the first pole of the supply source;

a first load resistor having a terminal connected to the emitter of the first bipolar power transistor;

a second load resistor having a terminal connected to the other terminal of the first load resistor; and a second bipolar power transistor of the same polarity as the first bipolar transistor, having its emitter connected to the other terminal of the second load resistor and its collector connected to the second pole of the supply source;

a first input of said interface amplifier, which is connected to the first output of said electronic amplifier circuit, being formed by the base of the second bipolar power transistor; and a second input of said interface amplifier, which is connected to the second output of said electronic amplifier circuit, being formed by the base of the first bipolar power transistor;

the output of said interface amplifier being formed by the connecting point of the first and second load resistors.

9. An electronic amplifier circuit having a high-impedance input and a low-impedance output, comprising:

a field effect transistor, the gate of which forms said input;

a first bipolar transistor having its base connected to the source of the field effect transistor and its emitter connected to the drain of the same transistor;

a first current source having one terminal connected to the emitter of the first bipolar transistor;

a supply source having two poles, the first of which is connected to the other terminal of the current source;

a first resistor having a terminal connected to the source of the field effect transistor; and an amplifier with a positive gain which is slightly less than unity, having its input connected to the drain of the field effect transistor, its output connected to the other terminal of the first resistor, and its supply terminals connected to the two poles of the supply source, the collector of the first bipolar transistor in turn being connected to the second pole of the supply source, the output of said circuit being formed either by the emitter of the first bipolar transistor or by the output of said amplifier.

10. An electronic amplifier circuit having a high-impedance input and a low-impedance output, comprising:

a field effect transistor, the gate of which forms said input;

a first bipolar transistor having its base connected to the source of the field effect transistor and its emitter connected to the drain of the same transistor;

a first current source having one terminal connected to the emitter of the first bipolar transistor;

a supply source having two poles, the first of which is connected to the other terminal of the current source;

a first resistor having a terminal connected to the source of the field effect transistor; and an amplifier with a positive gain which is slightly less than unity, having its input connected to the source of the field effect transistor, its output connected to the other terminal of the first resistor, and its supply terminals connected to the two poles of the supply source, the collector of the first bipolar transistor in turn being connected to the output of said amplifier, the output of said circuit being formed either by the emitter of the first bipolar transistor or by the output of said amplifier.

11. An electronic amplifier circuit having a high-impedance input and a low-impedance output, comprising:
- a field effect transistor, the gate of which forms said input;
- a first bipolar transistor having its base connected to the source of the field effect transistor and its emitter connected to the drain of the same transistor;
- a first current source having one terminal connected to the emitter of the first bipolar transistor;
- a supply source having two poles, the first of which is connected to the other terminal of the current source;
- a first resistor having a terminal connected to the source of the field effect transistor; and
- an amplifier with a positive gain which is slightly less than unity, having its input connected to the drain of the field effect transistor, its output connected to the other terminal of the first resistor, and its supply terminals connected to the two poles of the supply source, the collector of the first bipolar transistor in turn being connected to the output of said amplifier, the output of said circuit being formed either by the emitter of the first bipolar transistor or by the output of said amplifier.

* * * * *